United States Patent [19]
Seebauer et al.

[11] Patent Number: 5,633,036
[45] Date of Patent: May 27, 1997

[54] SELECTIVE LOW TEMPERATURE CHEMICAL VAPOR DEPOSITION OF TITANIUM DISILICIDE ONTO SILICON REGIONS

[75] Inventors: Edmund G. Seebauer, Urbana, Ill.; Michael A. Mendicino, Austin, Tex.

[73] Assignee: The Board of Trustees of the University of Illinois, Urbana, Ill.

[21] Appl. No.: 426,508

[22] Filed: Apr. 21, 1995

[51] Int. Cl.$^6$ .................................................. B05D 5/12
[52] U.S. Cl. .................... 438/665; 427/126.5; 438/677; 438/683
[58] Field of Search ................ 427/248.1, 255.1, 427/255.2, 126.1, 294; 437/228; 208/192, 25; 216/37

[56] References Cited

U.S. PATENT DOCUMENTS

| | | | |
|---|---|---|---|
| 4,640,844 | 2/1987 | Neppl et al. | 427/38 |
| 4,668,530 | 5/1987 | Reif et al. | 427/55 |
| 4,766,006 | 8/1988 | Gaczi | 427/38 |
| 4,904,620 | 2/1990 | Schmitz | 437/200 |
| 4,957,777 | 9/1990 | Ilderem et al. | 427/55 |
| 5,240,739 | 8/1993 | Doan et al. | 427/126.1 |
| 5,376,405 | 12/1994 | Doan et al. | 427/126.1 |

OTHER PUBLICATIONS

Effect of Silicon Surface Cleaning on the Initial Stage of Selective Titanium Silicide Chemical Vapor Deposition, K. Saito, T. Amazawa and Y. Arita, Jap. J. of Appl. Phys., 29 (1990) L185.

Selective Titanium Silicide Chemical Vapor Deposition with Surface Cleaning by Silane and Ohmic Contact Formation to Very Shallow Junctions, K. Saito, T. Amazawa and Y. Arita, J. Electrochem Soc., 140 (1993) 513.

A comparative study of TiSi$_2$ obtained by solid-state reaction and chemical vapor deposition, P. Gouy-Pailler, M. Haond, D. Mathiot, M. Gauneau, A. Perio, and J.L. Regolini, Appl. Surf. Sci. 73 (1993) 25.

Aspects of the selective deposition of TiSi$_2$ by LRP-CVD for use in ULSI submicron technology, J.L. Regolini, E. Mastromatteo, M. Gauneau, J. Mercier, D. Dutartre, G. Bomchil, C. Bernard, R. Madar and D. Bensahel, Appl. Surf. Sci. 53 (1991) 18.

Selective TiSi$_2$ Deposition with no Silicon Substrate Consumption by Rapid Thermal Processing in a LPCVD Reactor, J. Mercier, J.L. Regolini and D. Bensahel, J. Electron. Mater., 19 (1990) 253.

Kinetics aspects of TiSi$_2$ deposition without silicon consumption, D. Bensahel, J.L. Regolini and J. Mercier, Appl. Phys. Lett., 55 (1989) 1549.

(List continued on next page.)

*Primary Examiner*—Michael Lusignan
*Attorney, Agent, or Firm*—Greer, Burns & Crain, Ltd.

[57] ABSTRACT

The present invention concerns a completely selective and efficient method for chemical vapor deposition of titanium disilicide onto silicon regions of a silicon substrate including silicon dioxide regions. According to the method of the present invention a silicon substrate is heated to a low temperature. Silicon nucleation is induced by the introduction of a silicon precursor, such as silane. Silicon nucleates primarily on the silicon regions, with minimal nucleation on silicon dioxide regions. The silicon nuclei are then converted to titanium disilicide by the low pressure introduction of titanium tetrachloride with or without continued supply of silane. Etching, preferably using chlorine gas, is used to remove the titanium disilicide formed from conversion. The etching leaves the silicon dioxide regions completely intact, while the silicon region is slightly textured. Steady state growth is then induced on the silicon region with complete selectivity by the introduction of silane and titanium tetrachloride under low pressure and temperature conditions. During the steady state growth minimal silicon is consumed from the underlying silicon region.

12 Claims, 3 Drawing Sheets

OTHER PUBLICATIONS

Selective Layers of TiSi$_2$ Deposited Without Substrate Consumption In A Cold Wall LPCVD Reactor, J.L. Regolini, D. Bensahel, G. Bomchil and J. Mercier, Appl. Surf. Sci., 38 (1989) 408.

Formation of self–aligned TiSi$_2$ contacts to Si at low temperatures using TiCl$_4$ with selective in–situ predeposition of Si$_x$Ge$_{1-x}$, G.C. Xing and M.C. Öztürk, Mater. Lett., 17 (1993) 379.

Selective titanium disilicide by low–pressure chemical vapor deposition, G.J. Reynolds, C.B. Cooper III and P.J. Gaczi, J. Appl. Phys., 65 (1989) 3212.

Plasma Enhanced Chemical Vapor Deposition of Blanket TiSi$_2$ on Oxide Patterned Wafers I. Growth of Silicide, J. Lee and R. Reif, J. Electrochem. Soc., 139 (1992) 1159.

Plasma Enhanced Chemical Vapor Deposition of Blanket TiSi$_2$ on Oxide Patterned Wafers II. Silicide Properties, J. Lee and R. Reif, J. Electrochem. So., 139 (1992) 1166.

Selective Deposition of TiSi$_2$ on Oxide Patterned Wafers Using Low Pressure Chemical Vapor Deposition, J. Lee and R. Reif, J. Elctron. Mater, 20 (1991) 331.

Investigation of the Effects of Very Low Pressure Chemical Vapor Deposited TiSi$_2$ on Device Electrical Characteristics, V. Ilderem and R. Reif, J. Electrochem. Soc, 136 (1989) 2989.

Optimized Deposition Parameters for Low Pressure Chemical Vapor Deposited Titanium Silicide, V. Ilderem and R. Reif, J. Electrochem. So., 135 (1988) 2590.

Very low pressure chemical vapor deposition process for selective titanium silicide films, V. Ilderem and R. Reif, Appl. Phys. Lett., 53 (1988) 687.

Low pressure chemical vapor deposition of titanium silicide, P.K. Tedrow, V. Ilderem and R. Reif, Appl. Phys. Lett., 46 (1985) 189.

TiSi$_2$ Selective Growth in a Rapid Thermal Low Pressure Chemical Vapor Deposition System, A. Bouteville, J.C. Remy and C. Attuyt, J. Electrochem. Soc., 139 (1992) 2260.

LPCVD of Titanium Disilicide, A. Bouteville, A. Royer and J.C. Remy, J. Electrochem. Soc., 134 (1987) 2080.

Selective RTLPCVD of TiSi$_2$ without substrate consumption, A. Bouteville, C. Attuyt and J. C. Remy, Appl. Surf. Sci., 53 (1991) 11.

SELECTIVE LOW TEMPERATURE CHEMICAL VAPOR DEPOSITION OF TITANIUM DISILICIDE ONTO SILICON REGIONS

This invention was made with Government support under Contract No. CTS-8857037 awarded by the National Science Foundation. The Government has certain rights in the invention.

The present invention relates generally to an efficient process for forming titanium disilicide contact metallizations on silicon semiconductor devices while allowing for very shallow junction depths. More specifically, the present invention relates to a low temperature and low pressure chemical vapor deposition process for selectively forming regions of titanium disilicide onto a silicon substrate including a silicon region and a silicon dioxide region. According to the present invention the titanium disilicide forms on the silicon region with 100% selectivity at a consumption rate of less than 10% of the underlying silicon, at temperatures below approximately 800° C., and at growth rates approaching and exceeding 1000 Å per minute.

BACKGROUND OF THE INVENTION

Semiconductor integrated circuits are the fundamental building blocks of modern electronic devices. Computers, cellular phones, and consumer electronics rely extensively on these circuits, which may be used for storage of, computations on, and communication of data.

The most common semiconductor devices are formed using silicon as the primary substrate substance. Layers and regions of N-type material (such as elemental silicon), P-type material, and insulative material are combined to form electronic devices and circuits. N-type material is material which includes an excess of electrons, while P-type material is material having an excess of holes. Insulative material is highly resistive to the flow of electrical current and may be used to isolate N and P-type regions.

Silicon technology remains the most widely used in the realization of modern semiconductor devices due, in part, to its widespread availability and low cost. In silicon semiconductor devices, the insulative material usually takes the form of silicon dioxide ($SiO_2$). N and P-type regions are formed by doped regions of elemental silicon.

Complex electronic components are made by combining and arranging a large number of such semiconductor devices on a single substrate. The devices may be tightly packed into a single package known as an integrated circuit. As an example, a silicon microcomputer chip is an integrated circuit which may include millions of discrete semiconductor transistors and other devices.

In order to form a functional device, the discrete components of a chip package must be selectively interconnected to form a desired circuit. Over the years, aluminum metallization has been the primary vehicle by which interconnection is realized. Typically, metallization involves the deposition of aluminum over the entire silicon substrate. An etching procedure is then carried out to form the desired interconnection pattern.

More recently, titanium disilicide ($TiS_2$) has been utilized to effectuate contact to device active regions. Titanium disilicide is an attractive metallization material since its properties are advantageous in the manufacturing environment. Among these properties are high temperature stability, low resistivity, compatibility in existing fabrication techniques and excellent contact formation upon silicon regions.

A variety of techniques have been used to deposit titanium disilicide to form contacts on active regions. Included in those techniques are sputtering or evaporation with annealing, and chemical vapor deposition (CVD). A common sputtering and annealing technique is sometimes referred to as the salicide process. This process involves sputtering a blanket layer of titanium followed by annealing, to prevent lateral over-growth of silicide, in nitrogen at less than 700°. The titanium blanket does not react with silicon dioxide regions. Unreacted Ti and TiN are then selectively etched away followed by annealing at temperatures exceeding 750° C.

However, modern trends are toward even more tightly packed, i.e., more densely integrated, circuits. Additional goals include higher speed, lower power consumption, and greater ease of manufacturing. Improving those parameters has turned attention toward making active device regions more shallow. Blanket deposition and etching processes tend to consume underlying silicon in the active device regions and thereby limit the extent of shallowness which may be realized.

A particular sputtering and annealing technique which consumes underlying silicon is the salicide (self aligned silicide) process The salicide process consists of sputtering a layer of Ti metal, annealing in $N_2$ near 700° C., selectively etching the unreacted Ti and TiN, and then annealing at 750+° C. In the salicide process, all of the silicon for the formation of the titanium disilicide is supplied by the underlying silicon region. Formation occurs because the titanium blanket has a solid phase reaction with the silicon regions. The rate of underlying silicon consumption exceeds the percentage of titanium disilicide formed. Thus, as an example, formation of 2.52 Å layer of titanium disilicide will consume 2.27 Å of underlying silicon. In certain very shallow junction devices, the salicide process will consume too much underlying doped silicon. The doped active regions may form, for instance, the source or drain of a transistor. A CMOS transistor having a channel length of 0.25 μm should have a junction depth in the approximate range of 0.1 to 0.15 μm. Use of the salicide process limits thickness of the titanium disilicide layer to approximately 250 Å for the 0.1 μm junction device, while layers approaching 800 Å are desirable. For these reasons, it is difficult to realize the aforementioned goals relating to the tighter packing of integrated circuits.

Silicon on insulator technology (SOI) also demands minimal consumption. SOI typically involves growth of a thin silicon layer (500 to 1000 Å is common) on an insulator, such as silicon dioxide. Forming contacts with the silicon layer requires minimal consumption because of the thinness of the silicon layer.

Chemical vapor deposition techniques have also been investigated as possible methods for production of titanium disilicide layers. However, effectiveness of the techniques has been limited.

For a viable production using CVD, a number of critical parameters must be met simultaneously during growth. One such parameter is selectivity. Selectivity refers to the ability to limit titanium disilicide growth to the silicon regions. In a large scale commercial manufacturing environment, an effective deposition technique requires 100% selectivity, referring to the case where all growth is on silicon regions and no titanium disilicide forms on the silicon dioxide regions. Additionally, growth temperatures should be low enough to prevent redistribution of dopants in the silicon regions. Temperatures exceeding 750°–800° C. tend to allow high levels of dopant distribution.

Thickness of the titanium disilicide layer is also important. Typical integrated circuits utilize a thickness approaching 800 Å. With the device dimensions discussed above, the consumption of silicon should therefore be less than approximately 10%. Growth rates should also exceed approximately 1000 Å per minute to achieve economical wafer production. Finally, morphology of the substance must be good.

In sum, there is a need for a commercially viable selective chemical vapor deposition technique which will allow contacts to be formed on the increasingly compact and shallow silicon semiconductor devices, and which consumes minimal silicon from a silicon substrate while forming with 100% selectivity only on regions of silicon.

It is therefore an object of the present invention to provide an efficient process that exhibits 100% selectivity for commercially viable selective chemical vapor deposition of titanium disilicide onto a silicon substrate including silicon regions and silicon dioxide regions.

Another object of the present invention is to provide an efficient process for commercially viable selective chemical vapor deposition of titanium disilicide onto a silicon substrate which allows for the formation of sufficiently thick contacts, even with very shallow junction devices.

Still another object of the invention is to provide an efficient process for commercially viable selective chemical vapor deposition of titanium disilicide onto a silicon substrate which is conducted at a low temperature where dopant diffusion is negligible.

A further object of the invention is to provide a commercially viable selective chemical vapor deposition process that minimally consumes underlying silicon in the silicon regions and is applicable to silicon on insulator technology.

SUMMARY OF THE INVENTION

According to the present invention, an efficient and commercially viable chemical vapor deposition process for deposition of titanium disilicide onto a silicon substrate is realized. The silicon substrate includes regions of silicon and silicon dioxide. Through the method of the present invention, titanium disilicide is deposited with 100% selectivity on the silicon regions at low temperatures and with minimal consumption of underlying silicon. Preferably, temperatures of at or below 750° C. are utilized to avoid dopant redistribution, but good deposition will occur in the approximate temperature range of 650° C. to 800° C. Silicon consumption from the underlying silicon may be kept below 10% and may be made arbitrarily small to about zero. Growth rates in the approximate range of 500 Å to 5000 Å per minute are achieved.

The process according to the present invention includes a preliminary preparatory phase of silicon nucleation. A silicon substrate in a growth reactor is heated to a low growth temperature and a silicon precursor, preferably silane, is introduced at low pressure. Silicon nucleation occurs primarily on the silicon regions of the substrate leaving a textured surface, with minimal nucleation on silicon dioxide regions. A titanium precursor, preferably titanium tetrachloride, is then introduced to convert the silicon nuclei to titanium disilicide. Silane introduction may continue or be halted during conversion, but the pressure of the titanium tetrachloride must be sufficient to react with the silicon nuclei. Subsequent to conversion, temperature is reduced, an etchant is introduced, preferably chlorine, and the titanium disilicide is removed while the silicon regions remain slightly textured. This prepares the silicon surface for steady state selective growth of titanium disilicide onto the silicon regions. Preparation being complete, steady state controlled growth of titanium disilicide is conducted solely on the silicon regions. During growth, the initial nucleation temperature range is utilized with continued or restarred introduction of silane, and introduction of titanium tetrachloride at pressure low enough to avoid consumption of silicon from the silicon region. The silane and titanium tetrachloride react to form a titanium disilicide layer of desired thickness. The layer formation is strictly limited to the silicon regions.

BRIEF DESCRIPTION OF THE DRAWINGS

Other features, objects and advantages of the present invention will be apparent to those skilled in the art with reference to the detailed description and the drawings, of which.

DETAILED DESCRIPTION OF THE INVENTION

A specific embodiment for practicing the present invention will now be described with reference to the drawings. The invention may be practiced by using any reactor system for performing chemical vapor deposition. As an example, a Genus Model 8710 cold wall LPCVD reactor is suitable for practicing the present invention. Common to all such reactors is the ability to react gases or vapors chemically so that a solid may be formed, i.e., deposited, on a substrate within the reactor system.

Referring now to FIGS. 1a–1e, shown is a silicon substrate 10 having a silicon region 12 and a silicon dioxide region 14. An exposed surface 16 of the silicon region 12 is an area onto which a titanium disilicide contact for interconnection to other regions is to be formed.

Any conventional or yet to be discovered method may be used to produce the substrate 10. In commercial applications the substrate 10 will have a large number of discrete silicon and silicon dioxide regions. Silicon regions will be N type and P-type. Introduction of impurities into the silicon regions to form N and P-type regions may be performed by any conventional or yet to be discovered technique, examples of which are doping and ion implantation.

Figure 1A:
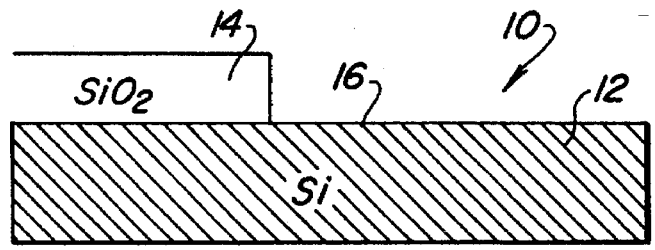
FIGS. 1a, 1b, 1c, 1d and 1e illustrate effects of silicon nucleation and subsequent steady state growth procedure in accordance with the present invention.
Figure 1B:
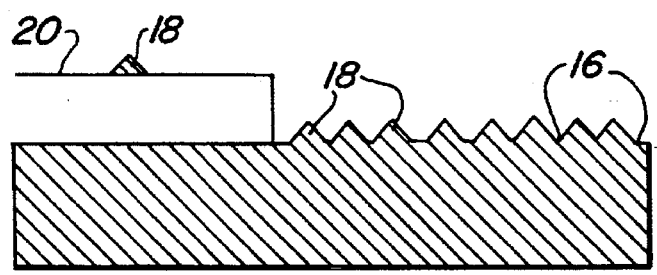

Preparation of the substrate 10 for deposition of titanium disilicide on the silicon regions 12 begins with formation of silicon nuclei 18 and is illustrated in FIG. 1b. The nucleation is induced in the following manner.

Substrate 10 is heated to a low growth temperature. Preferably the temperature is at or below approximately 750° C., as the lower temperature is less likely to induce diffusion of the impurities in the silicon region that are responsible for the conduction type of the region. However, temperatures in the approximate range of 650° C. to 800° C. may be used. At higher temperatures, the impurities are reactive and diffuse into unintended regions. In other words, the distinctly formed N and P type regions may be lost or compromised through the reaction and diffusion of dopants at temperatures substantially exceeding 750° C.

Silicon for nucleation is supplied from silane ($SiH_4$) introduced at a low supply pressure in the approximate range of 0.5 to 5 mTorr. As seen in FIG. 1b, silicon nuclei 18 form on the silicon region surface 16. In microscopic imaging techniques the nuclei 18 appear rounded, and resemble liquid droplets in appearance, but are crystalline. The result of silicon deposition on the silicon region surface 16 gives the surface 16 a highly defected appearance. However, the deposition process is not entirely selective and a small amount of silicon nuclei 18 may also deposit on a surface 20 of the silicon dioxide region 14.

Selectivity of the deposition depicted in FIG 1a is influenced by the cleanliness of the surface 20 of the silicon dioxide region 14. Silane pressure and deposition time may also affect the selectivity. Defects in the silicon dioxide surface 20 result in active absorption sites on which nucleation may take place. Careful handling of the substrates or cleansing prior to growth reduces the amount of nucleation on the silicon dioxide surface 20, but even in that case minimal nucleation will occur upon the silicon dioxide surface 20.

Nucleation is carried out for approximately 12–200 seconds to form a sufficiently thick silicon nucleation layer. Preferably, silicon nuclei in the approximate thickness range of 50–100 Å are deposited, as this thickness best promotes nucleation of titanium disilicide later in the process. However, as little as 20 Å of deposition is sufficient to induce enough surface defects to enhance titanium disilicide nucleation. This minimal silicon nucleation thickness results in a slower titanium disilicide deposition growth than the higher rates.

Figure 1C:
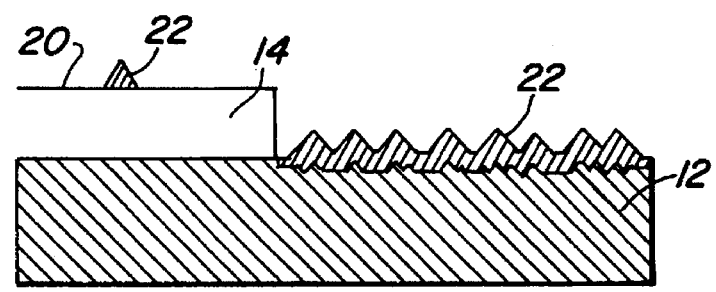

Addressing the lack of complete selectivity in the silicon nucleation phase of FIG. 1b, a silicon conversion step is carried out, and is depicted in FIG. 1c. Silicon nuclei 18 formed during nucleation are converted to titanium disilicide 22 through the introduction of titanium tetrachloride ($TiCl_4$) into the reaction chamber.

Source pressure for the titanium tetrachloride is in the approximate range of 0.1 to 2 mTorr. Silane pressure is maintained from the nucleation procedure in the approximate range of 0.5 to 5 mTorr, while the substrate temperature is maintained in the approximate range of 650° to 800° C.

Maintaining silane pressure during conversion is convenient, but the silane may be shut off during this step. If silane is shut off a lower pressure of titanium tetrachloride may be used, down to about 0.02 mTorr. When the silane introduction is maintained higher titanium tetrachloride pressure is necessary to react with the silicon nuclei.

The titanium tetrachloride reacts with the silicon nuclei 18 and the silicon region surface 16 to form titanium disilicide 22. If silane introduction is maintained, additional silicide forms on the silicon region 12 which is superfluous, but not harmful. As shown in FIG. 1c, all silicon nuclei 18 are converted. An irregular thin titanium disilicide layer of the silicon region 12 is also converted, but the silicon dioxide surface 20 is left completely intact. In an approximate time of 10 to 60 seconds all silicon nuclei are converted, and a thin titanium disilicide layer of preferably 50 to 100 Å is formed from the underlying silicon region 12 at the surface 16. Reducing or expanding the conversion time will affect the amount of consumption of underlying silicon. Importantly, all of the silicon nuclei formed upon the silicon dioxide region are converted to titanium disilicide.

During conversion, a minimal amount of underlying silicon is consumed. As will be appreciated by those skilled in the art, control of the time of the conversion can make the consumption rate arbitrarily small compared to the contact layer of titanium disilicide which is eventually formed according to the present invention. As an example, where approximately 50 Å are consumed from the layer 12 and an 800 Å contact layer of titanium disilicide is formed, the consumption rate is $50/800$, or 6.25%. However, even in that case, most of the silicon consumption is of the silicon nuclei 18 which were previously formed. Thus, consumption from the region 12 is even smaller and may be kept to zero, depending upon the time allowed for conversion. The present invention allows consumption of silicon to be kept at approximately 10% or below, while forming useful thicknesses of titanium disilicide contacts of 500 to 5000 Å or more.

Such minimal consumption of underlying silicon is conducive to the formation of very shallow junction devices. As discussed above, the salicide process derives all of the silicon within the titanium disilicide from the underlying silicon region. This limits the thinness of the junction depth which may be used along with the titanium disilicide contacts formed by the salicide process.

Figure 1D:
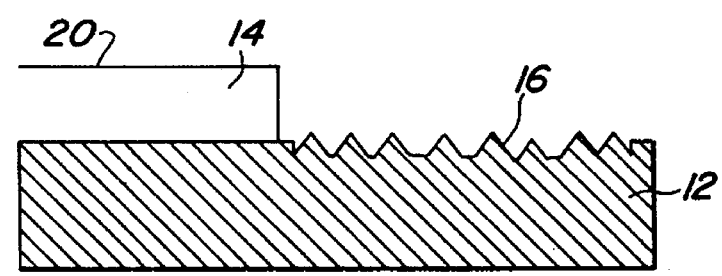
Figure 1E:
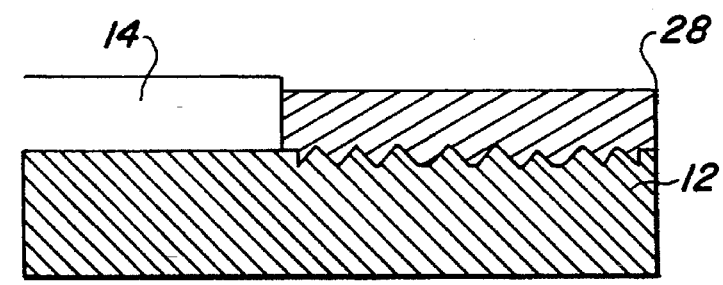

While the consumption according to the present invention from the underlying silicon region 12 may be reduced to approach zero percent of the titanium disilicide contact formed, some minimal consumption is preferable. As is illustrated in FIG. 1d, the titanium disilicide (including the minimal amount formed from underlying silicon conversion) is selectively etched away to leave a roughened silicon surface 16 which acts as a good interface for subsequent nucleation and steady state growth of titanium disilicide. Additionally, if it is assumed that the thickness of any silicon nuclei on the silicon dioxide surface approximate those formed on the silicon surface 16, then consuming some silicon from the silicon surface 16 also insures that silicon nuclei formed on the silicon dioxide surface are completely converted prior to etching. Such an assumption is conservative however, because the silicon nucleation of FIG. 1b is largely selective. In practice, silicon nuclei 18 on the silicon dioxide region 14 are likely to be smaller than those formed on the silicon region 12. For this reason, even where no silicon is consumed from region 12, all converted nuclei can be removed from region 14.

The selective etching producing the roughened silicon surface 16 is carried out through introduction of chlorine gas ($Cl_2$) at a source pressure in the approximate range of 0.2 to 2 mTorr. Other halogenated etchants having similar properties should also be effective. As an example, hydrogen chloride (HCl) should produce the same effect. Similarly, other halides or halide compounds should also etch the titanium disilicide, as long as etchant selectivity is maintained. Finally, the silane source and titanium source may or may not be removed during etching.

Prior to the introduction of the chlorine, substrate temperature is lowered to the approximate range of 400° to 550° C. Within approximately 5–30 seconds, the titanium disilicide formed from the converted silicon nuclei is completely etched away. No reaction occurs with the silicon dioxide region 14, and the underlying silicon region surface 16 is also virtually untouched. Undesired nuclei are completely removed from the silicon dioxide region 14, and a roughened silicon surface with areas suitable for titanium disilicide nucleation is left on the silicon region surface 16. After etching is complete, the etchant gas is quickly pumped from the reaction chamber. Any silicon nuclei 18, as well as minimal underlying silicon consumed during the conversion step, are lost during the etching process.

Thus, absolute selectivity is obtained during the etching with the silicon dioxide region 14 left completely intact and unaffected, while the silicon region surface 16 is prepared for nucleation of titanium disilicide. The good control is attributable to the large difference of etch rates of titanium disilicide compared to silicon and silicon dioxide.

Figure 2:
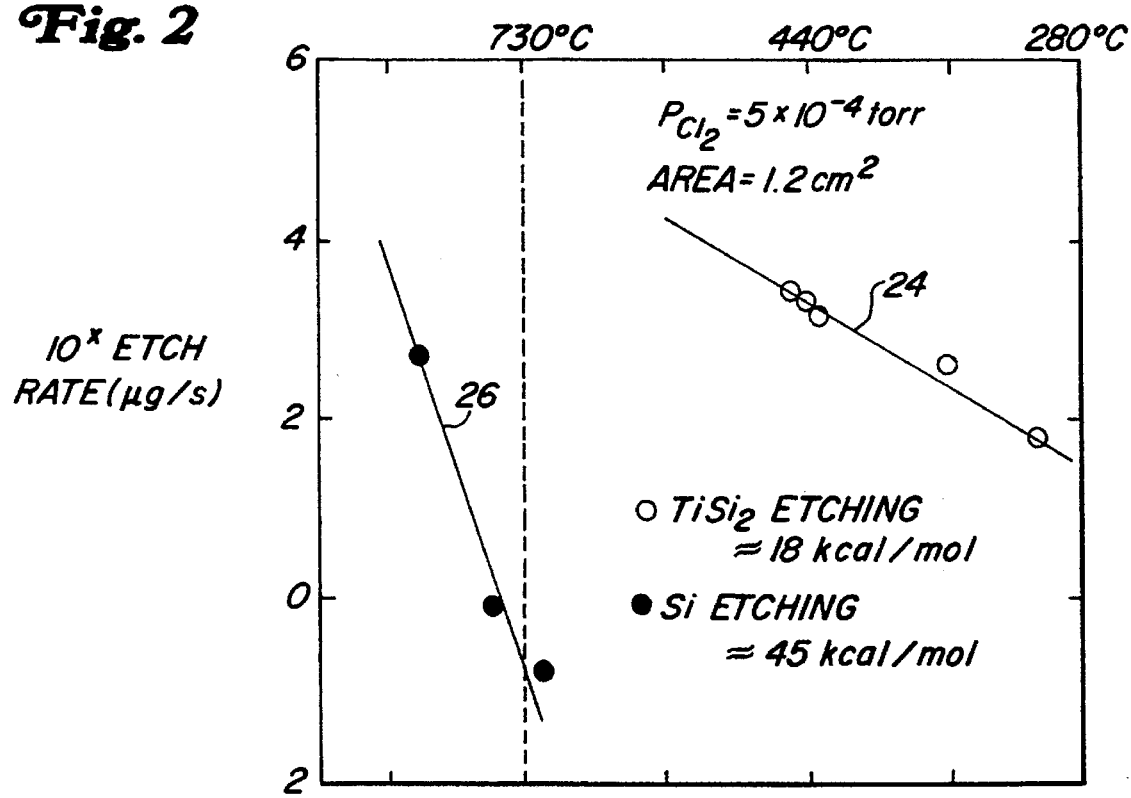
FIG. 2 is a plot of etch rates versus temperature for chlorine etching of titanium disilicide and silicon, illustrating a selective etching process used in accordance with the present invention and producing the effect illustrated in FIG. 1d.

Referring now to FIG. 2 shown is a plot of etch rates (expressed exponentially) versus temperature for chlorine etching of titanium disilicide and silicon for a 1.2 cm$^2$ silicon sample having one side coated with silicon dioxide. Data for the plot was obtained through etching of titanium disilicide grown by CVD and p-type, B-doped silicon.

As seen in the plot, titanium disilicide etching with chlorine requires a low activation energy of approximately 18 kcal/mole. In contrast, the activation energy for the silicon etching is approximately 45 kcal/mole. The line 24 tracks titanium disilicide etching, and the line 26 silicon etching. No data is shown for silicon dioxide since no etching was detected for a sample subjected to 1 mTorr of $Cl_2$ at up to 800° C., indicating an even higher activation energy requirement for the chlorine-silicon dioxide reaction.

Apparent from FIG. 2 is the difference by several orders of magnitude between silicon etching and titanium disilicide etching below approximately 730° C. At higher temperatures, the etch rates tracked by lines 24 and 26 will tend to converge. For temperatures in the approximate range of 400° to 550° C. virtually no silicon etching occurs, but the titanium disilicide is etched at a rate sufficient to efficiently remove the titanium disilicide, as illustrated from FIG. 1c to FIG. 1d. At the lower end of the temperature range, chlorine pressures in the upper end of the 0.2 to 1 mTorr range should be used. HCl should produce a more dramatic difference allowing higher temperatures, since HCl is even less reactive toward silicon than $Cl_2$.

Completion of the etching, illustrated in FIG. 1d, is the final preparatory step for steady state growth of titanium disilicide. After a period of steady state growth a titanium disilicide layer is formed only upon the silicon region 12 through introduction of silane and titanium tetrachloride at low temperature.

Figure 3:
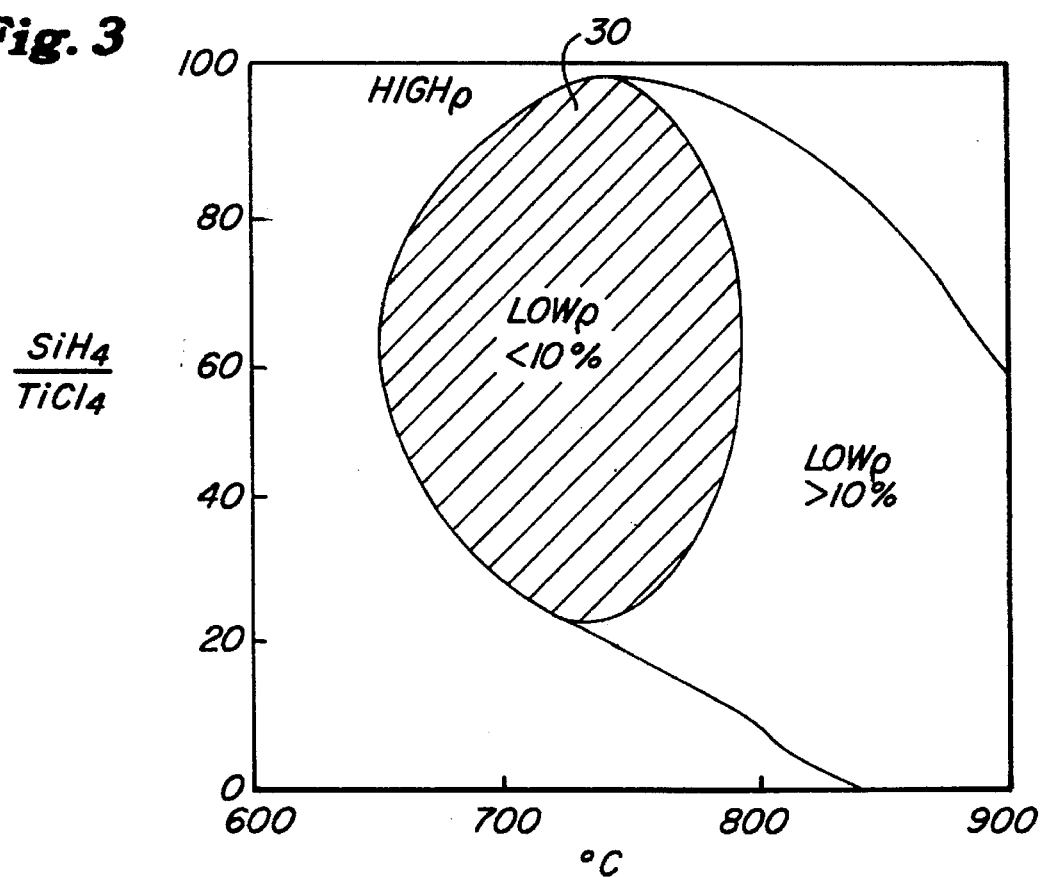
FIG. 3 is a steady state growth plot of supply pressure ratio of silane to titanium tetrachloride versus substrate temperature for titanium tetrachloride supply pressure of approximately 0.02 mTorr.
Figure 4:
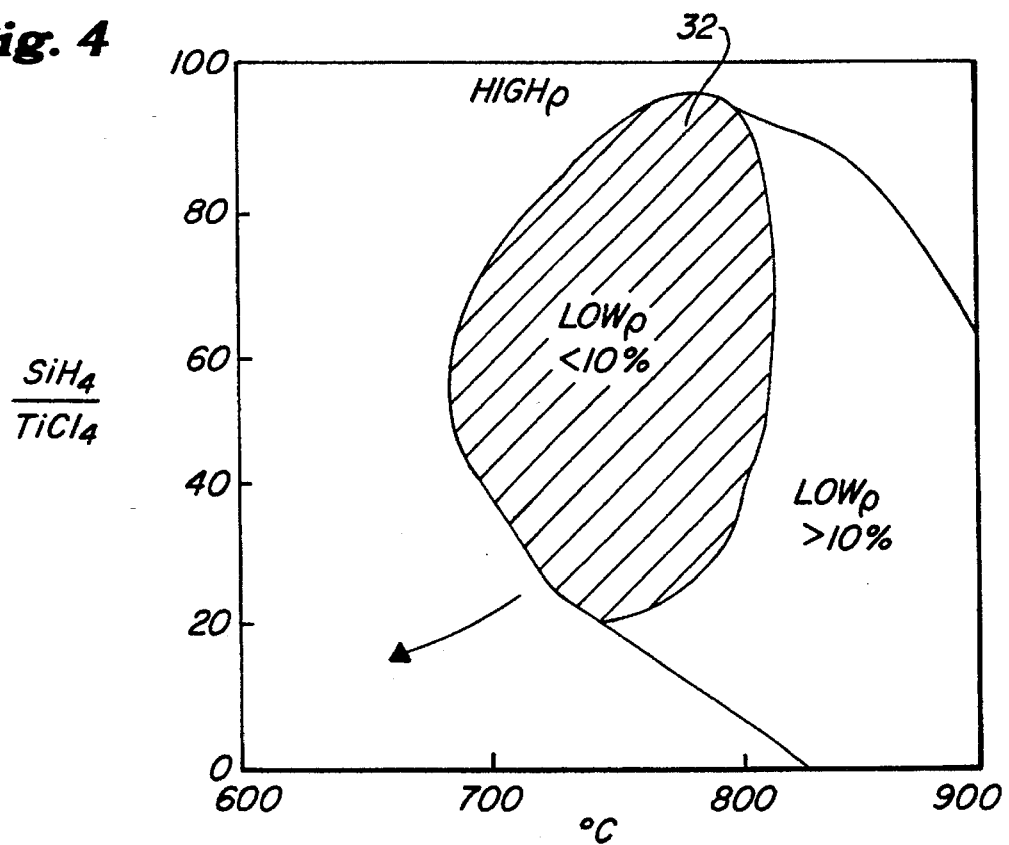
FIG. 4 is a steady state growth plot of supply pressure ratio of silane to titanium tetrachloride versus substrate temperature for a titanium tetrachloride supply pressure of approximately 0.2 mTorr.

Conditions for the steady state growth will now be discussed with reference to FIG. 3 and 4. FIG. 3 is a plot of supply pressure ratio of silane to titanium tetrachloride versus substrate temperature for a titanium tetrachloride supply pressure of approximately 0.02 mTorr. FIG. 4 is an identical plot for a titanium tetrachloride supply pressure of 0.2 mTorr. Approximate desired growth windows, 30 and 32, in which the titanium disilicide region has low resistivity (15–20 µΩ/cm) and minimal underlying silicon is consumed, are shaded.

Generally, the steady state growth is induced by returning the substrate to the silicon nucleation temperature, in the approximate 650° to 800° C. range, holding the silane temperature to its nucleation range (0.5 to 5 mTorr) and reducing the titanium tetrachloride pressure to approximately half (up to 1 Torr) of the nucleation pressure in the case where silane introduction is continued. However, as discussed above, in the absence of silane the pressure may be as low as 0.02 mTorr. Below that point growth becomes very slow. As the titanium tetrachloride pressure increases, the allowable temperature range for minimal consumption decreases. Complete collapse of the temperature range happens as the titanium tetrachloride exceeds approximately 1 mTorr. The shrinking in the window is apparent from comparing the window 30 to window 32. Also apparent is the upward movement in temperature range of the window 32 compared to the window 30. Low pressure is important during the steady state growth since absorbed chlorine concentration during growth must be low enough so that silane may absorb into the titanium disilicide layer 28, thereby avoiding consumption of the underlying silicon in the silicon region 12.

Windows for other pressures of titanium tetrachloride may be obtained through linear interpolation of the windows 30 and 32. Sample layers indicate that for pressures of between 1 µTorr and 1 mTorr, pressure ratios of 20–100 with temperature ranges of 650° to 800° C. will provide an efficient window for growth with minimal consumption of underlying silicon. In that range, silane will be absorbed into the layer 28 to supply the silicon necessary for formation of titanium disilicide.

The silicide grown by the process described above has been characterized in several ways. Its resistivity varies between 15 and 20 µΩ-cm. Its crystal structure as given by X-ray diffraction corresponds to the C54 structure of titanium silicide textured in the (004) direction. Examination by secondary ion mass spectroscopy shows contamination levels of 3 ppt for carbon, 500 ppm for oxygen, and 5 ppm for chlorine. The grown material is stoichiometric (2:1 Si:Ti) except at the highest ratios of silane to $TiCl_4$. Under such conditions, small amounts of elemental silicon co-deposit with the silicide. The utility of the grown material is not diminished by such co-deposition, as the resistivity remains quite low.

Figure 5A:
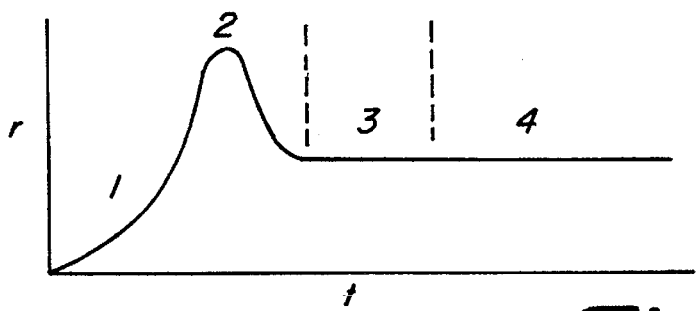
FIG. 5a is a plot of titanium disilicide growth rate over time.
Figure 5B:
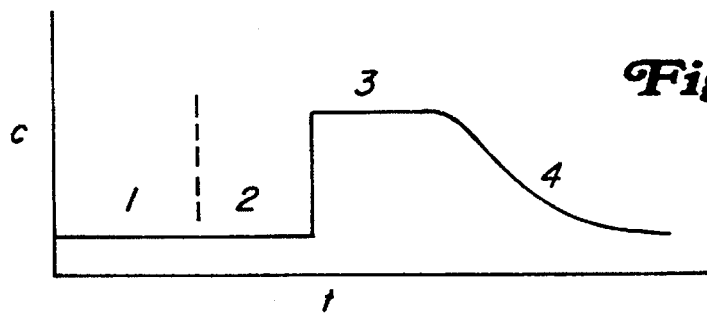
FIG. 5b plots instantaneous silicon consumption rate over time.

As shown in FIGS. 5a and 5b, there are 4 regimes of growth for titanium silicide on silicon. FIG. 5a is a plot of growth rate (arbitrary units) of titanium disilicide over time, while FIG. 5b plots instantaneous silicon consumption rate (arbitrary units) over time.

In regime 1, the silicide film grows primarily as small nuclei, is discontinuous, and has the C49 structure. The growth rate increases with time, but the rate of consumption remains stable. In regime 2, the growth rate reaches a maximum and then decreases. The consumption remains stable at its previous level. In this regime, the film coalesces into a continuous unit, and the C49 structure transforms into the desired C54 structure. In the third regime, both the growth rate and the consumption rate are constant, but the consumption rate is significantly higher than it was earlier. This regime begins when the film is between 800 and 2000 angstroms thick. In the fourth regime, the consumption rate decreases while the growth rate remains constant. This regime begins after about 1 micron of growth. Regimes 1 and 2 are most desirable for growth, because the substrate consumption is small and stable. This characteristic leads to good process controllability. In regime 3, the undesired consumption increases and changes with time.

The transition between regime 2 and 3 occurs at thicknesses of technological interest in integrated circuit fabrication. It is therefore desirable to determine how thick the silicide film should be before choosing the optimal growth conditions. The thickness at which the transition takes place increases as the $TiCl_4$ pressure and temperature decrease.

While a particular embodiment of the present invention has been described, it will be appreciated by those skilled in the art that changes and modification may be made thereto without departing from the invention in its broader aspects and as set forth in the following claims. The method of the present invention may be used to form contacts for silicon semiconductor devices of any type. Many applications of the method of the present invention will be readily apparent to those skilled in the art.

What is claimed is:

1. A process for selective chemical vapor deposition of titanium disilicide onto a silicon substrate having a silicon region and a silicon dioxide region comprising the steps of:

heating the silicon substrate in a growth reactor to a low growth temperature of approximately 750° C. or less;

forming silicon nuclei primarily on the silicon region through introduction of a silicon source gas at a low supply pressure in the approximate range of 0.5 to 5 mTorr;

converting said silicon nuclei to titanium disilicide;

etching the titanium disilicide formed from said convening to remove any titanium disilicide formed upon the silicon dioxide region and the silicon region, and to prepare the silicon region for growth of titanium disilicide; and selectively growing a layer of titanium disilicide on the silicon region through introduction of said silicon source .gas at said low supply pressure along with a titanium source gas, wherein the pressure ratio of said silicon source gas to said titanium source gas is in the approximate range of 20–100, and said selective growing is accomplished with a silicon substrate consumption rate of approximately 10% or less.

2. A process for selective chemical vapor deposition according to claim 1, wherein said silicon gas source is silane.

3. A process for selective chemical vapor deposition according to claim 2, wherein:

said step of converting is carried out through the introduction of titanium tetrachloride at a pressure in the approximate range of 0.02 mTorr to 2 mTorr.

4. A process for selective chemical vapor deposition according to claim 3, wherein:

said step of etching is carried out through the introduction of chlorine gas, the substrate temperature being reduced from said low growth temperature, and said substrate is returned to said low growth temperature prior to said step of selectively growing.

5. A process for selective chemical vapor deposition according to claim 3, wherein:

said step of etching is carried out through the introduction of hydrogen chloride, the substrate temperature being reduced from said low growth temperature, and said substrate is returned to said low growth temperature prior to said step of selectively growing.

6. A process for selective chemical vapor deposition according to claim 4, wherein said titanium source gas is titanium tetrachloride:

7. A process for chemical vapor deposition according to claim 6, wherein said titanium tetrachloride pressure is below approximately 1 mTorr during said step of selectively growing.

8. A process for chemical vapor deposition according to claim 7, wherein:

said low growth temperature is in the approximate range of 650° C. to 750° C.

9. A process for chemical vapor deposition according to claim 1, further comprising the steps of:

pumping away gases in said growth reactor subsequent to said step of selective growing; and cooling said substrate subsequent to said step of pumping away.

10. A process for selective chemical vapor deposition of titanium disilicide onto a silicon substrate having a silicon region and a silicon dioxide region comprising the steps of:

preparing the silicon region through silicon nucleation and subsequent removal of nuclei from the silicon dioxide region; and selectively growing a layer of titanium disilicide on the silicon region with a silicon substrate consumption rate of approximately 10% of less after said removal by introducing silane and titanium tetrachloride into the growth reactor at low temperature of approximately 750° C. or less, wherein the source pressure of the titanium tetrachloride is below approximately 1 mTorr and the pressure ratio of silane to titanium tetrachloride is in the approximate range of 20–100.

11. A process for selective chemical vapor deposition according to claim 10, wherein:

the silicon substrate is maintained at a temperature in the approximate range of 650° C. to 750° C. during said step of selectively growing.

12. A process for selective chemical vapor deposition according to claim 11, wherein:

said step of selective growing deposits titanium disilicide at a rate exceeding approximately 1000 Å per minute.

* * * * *

UNITED STATES PATENT AND TRADEMARK OFFICE
CERTIFICATE OF CORRECTION

PATENT NO. : 5,633,036
DATED : May 27, 1997
INVENTOR(S) : Seebauer et al.

It is certified that error appears in the above-indentified patent and that said Letters Patent is hereby corrected as shown below:

Column 2, line 24, delete "process" and insert --process.-- therefor.

Column 5, line 48, delete "(TICl₄)" and insert --(TiCl₄)-- therefor.

Column 8, line 1, delete "1 Torr" and insert --1m Torr-- therefor.

Signed and Sealed this

Twenty-sixth Day of May, 1998

Attest:

BRUCE LEHMAN

Attesting Officer          Commissioner of Patents and Trademarks